United States Patent [19]

Michon et al.

[11] 4,011,441
[45] Mar. 8, 1977

[54] SOLID STATE IMAGING APPARATUS

[75] Inventors: Gerald J. Michon, Waterford; Hubert K. Burke, Scotia, both of N.Y.

[73] Assignee: General Electric Company, Schenectady, N.Y.

[22] Filed: Dec. 22, 1975

[21] Appl. No.: 643,560

[52] U.S. Cl. .............................. 235/193; 250/211 J; 307/221 D; 340/173 LS; 358/213
[51] Int. Cl.² ...................... G06G 7/12; H04N 3/14
[58] Field of Search .................. 235/193, 156, 152; 178/7.1, DIG. 3, DIG. 12; 250/211 J, 211 R, 578; 357/24, 30, 32; 307/221 C, 221 D; 340/173 LS

[56] References Cited
UNITED STATES PATENTS

| | | | |
|---|---|---|---|
| 3,488,508 | 1/1970 | Weimer | 250/211 J |
| 3,801,820 | 4/1974 | Eichelberger et al. | 250/211 J |
| 3,856,989 | 12/1974 | Weimer | 178/7.1 |
| 3,904,818 | 9/1975 | Kovac | 250/211 J X |
| 3,919,468 | 11/1975 | Weimer | 178/7.1 |

OTHER PUBLICATIONS

Pratt et al., "Hadamaro Transform Image Coding", Proceedings of the IEEE, vol. 57, No. 1, Jan. 1969, pp. 58–68.

Primary Examiner—Joseph F. Ruggiero
Attorney, Agent, or Firm—Julius J. Zaskalicky; Joseph T. Cohen; Jerome C. Squillaro

[57] ABSTRACT

Relates to an imaging array of charge storage devices each including a pair of closely coupled conductor-insulator-semiconductor cells, one a row line connected cell and the other a column line connected cell. By transferring signal charge in a row of devices simultaneously between the cells of each device and reading out the resultant signal on the row line common to the devices, a spatial transform of an image is directly read from the array.

5 Claims, 32 Drawing Figures

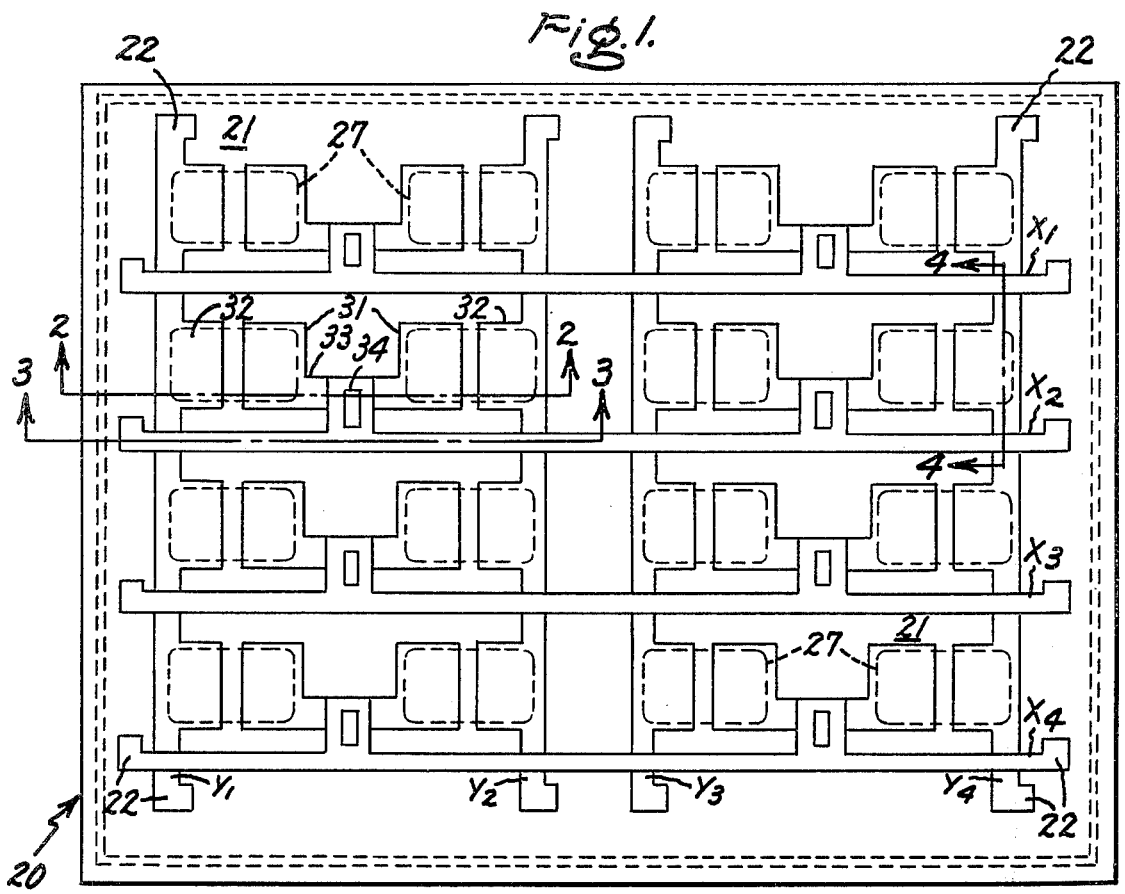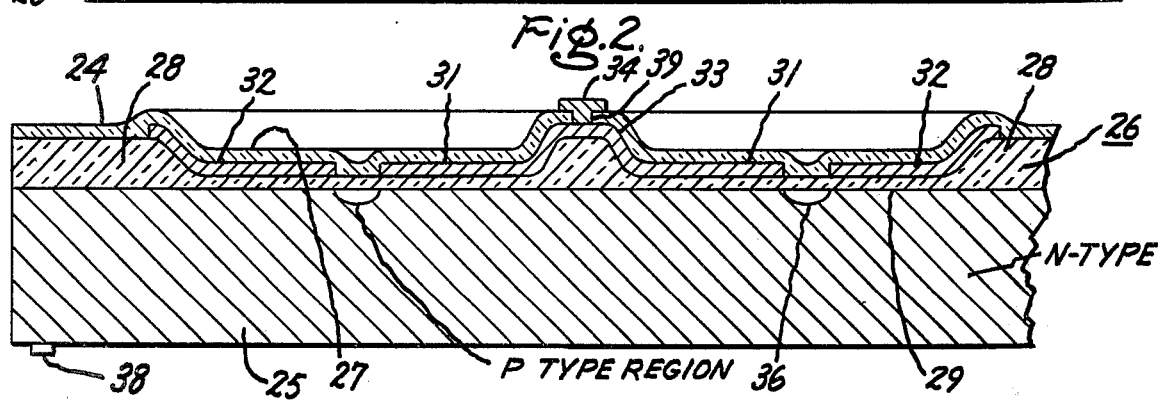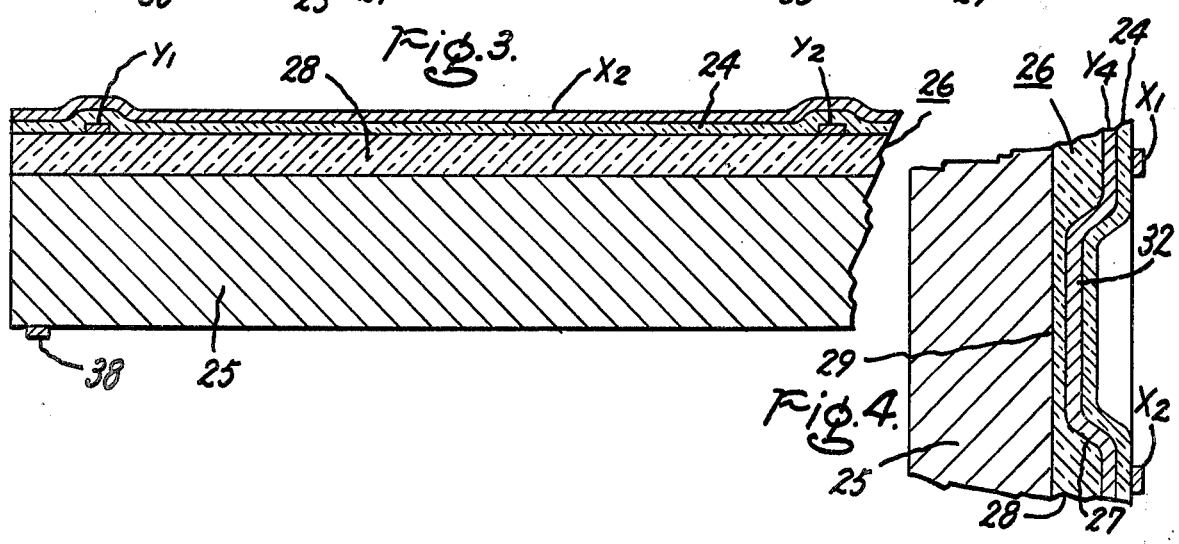

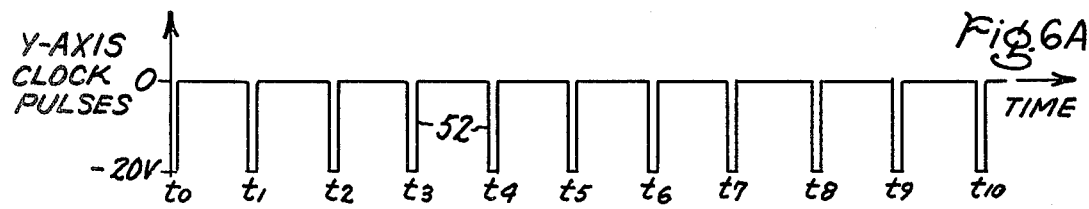
Fig. 6A
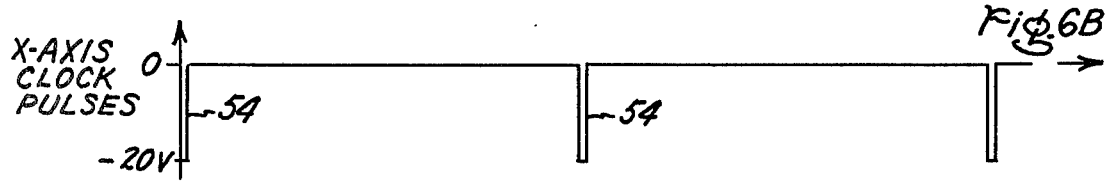
Fig. 6B
Fig. 6C
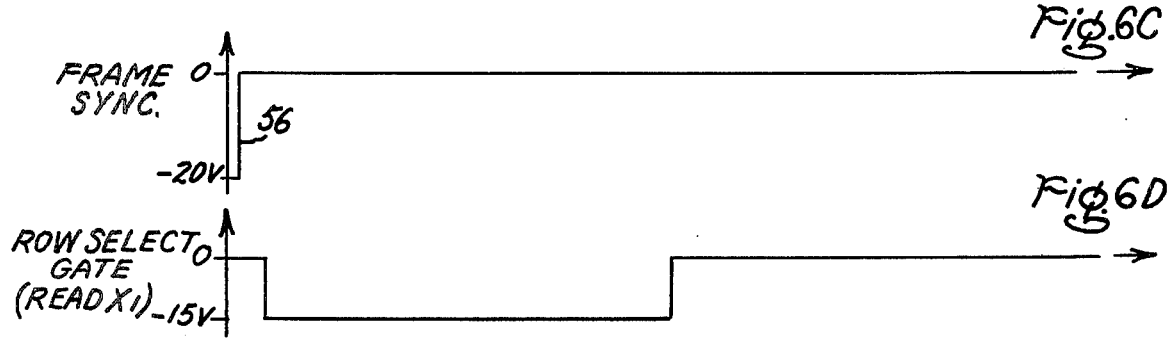
Fig. 6D
Fig. 6E
Fig. 6F
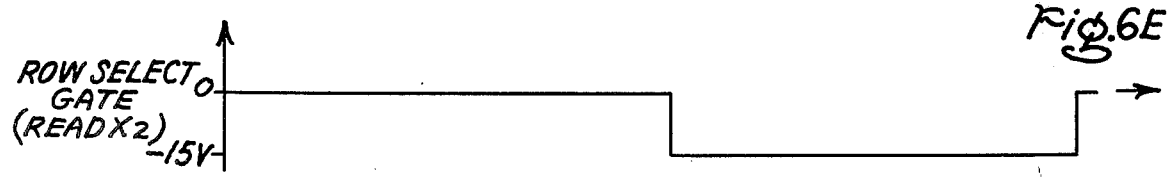
Fig. 6G
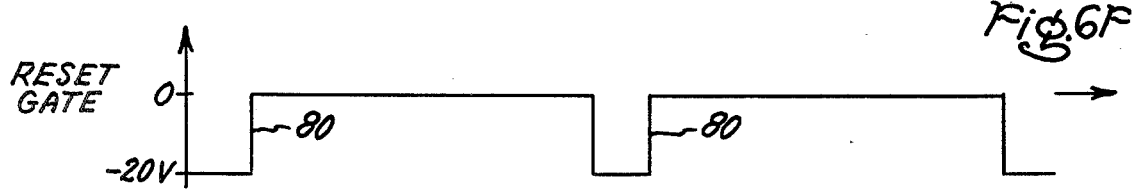
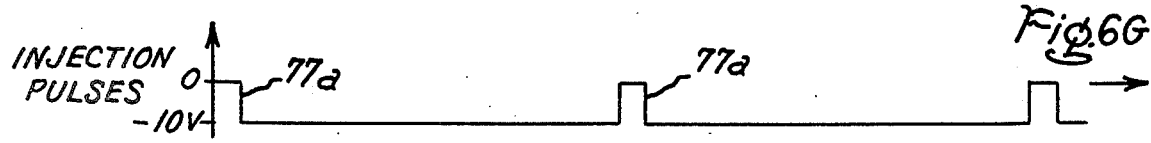
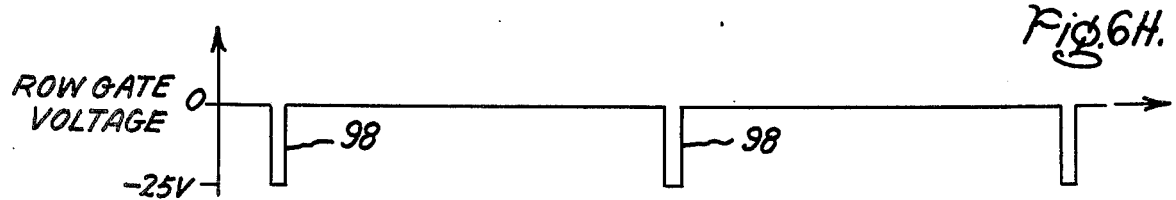
Fig. 6H.

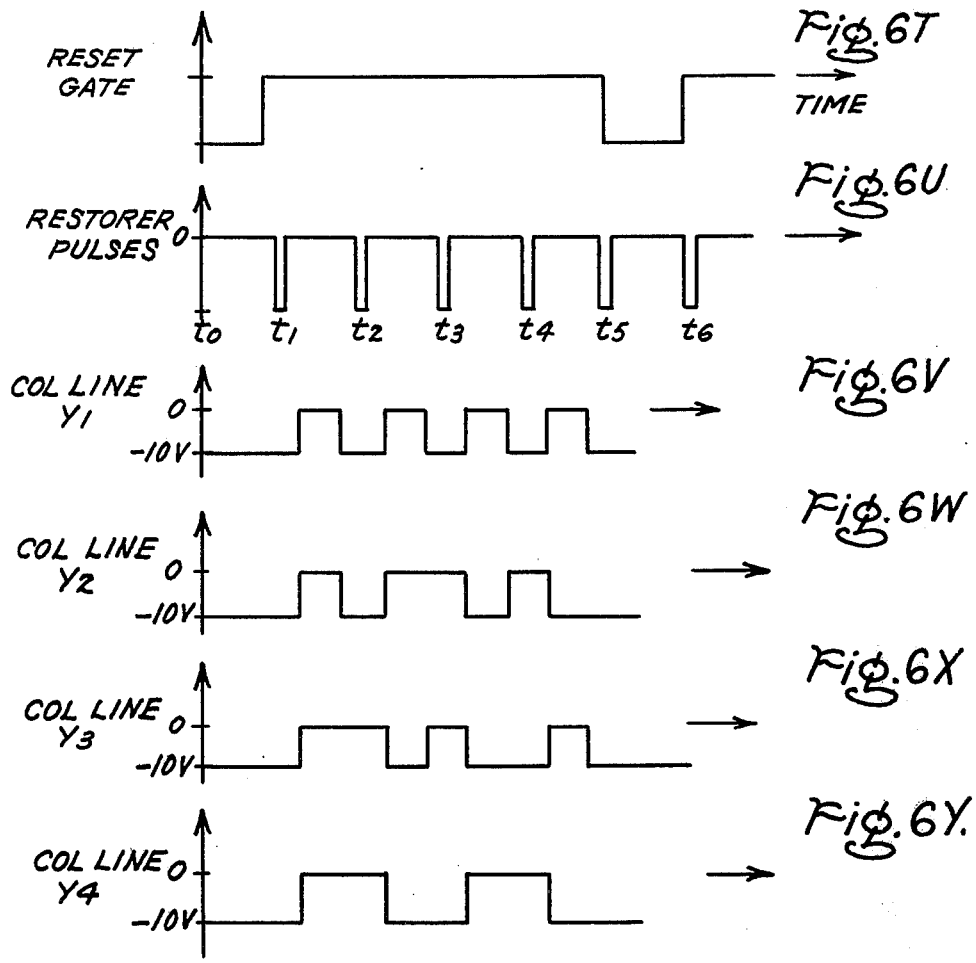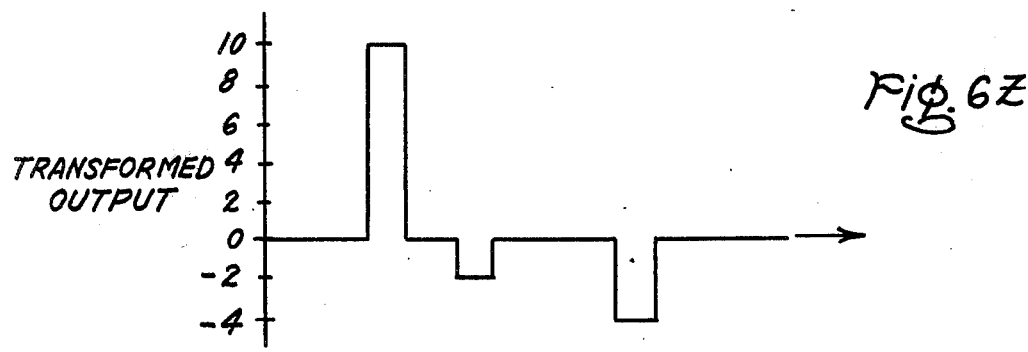

Fig. 7.

TABLE-1
CODE

|   | 1 | 2 | 3 | 4 |
|---|---|---|---|---|
| A | + | + | + | + |
| B | + | + | − | − |
| C | + | − | − | + |
| D | + | − | + | − |

TABLE-2

$$E_1 + E_2 + E_3 + E_4 = \Sigma_A$$

$$E_1 + E_2 - E_3 - E_4 = \Sigma_B$$

$$E_1 - E_2 - E_3 + E_4 = \Sigma_C$$

$$E_1 - E_2 + E_3 - E_4 = \Sigma_D$$

TABLE-3

$$\Sigma_A + \Sigma_B + \Sigma_C + \Sigma_D = 4E_1$$

$$\Sigma_A + \Sigma_B - \Sigma_C - \Sigma_D = 4E_2$$

$$\Sigma_A - \Sigma_B - \Sigma_C + \Sigma_D = 4E_3$$

$$\Sigma_A - \Sigma_B + \Sigma_C - \Sigma_D = 4E_4$$

SOLID STATE IMAGING APPARATUS

The present invention relates to solid state imaging apparatus for sensing patterns of radiation imaged thereon and developing electrical signals in accordance therewith. The present invention relates in particular to such apparatus including an array of semiconductor imaging devices which stores charge produced by electromagnetic radiation flux incident on the array and which provides an electrical readout of the stored charge.

This application relates to improvements in the apparatus of U.S. Pat. No. 3,805,062, assigned to the assignee of the present application and incorporated herein by reference thereto.

This application is related to patent application Ser. No. 643,539 filed concurrently herewith and assigned to the assignee of the present application.

In radiation sensing apparatus such as referred to above the charge stored in each device is individually addressed in various ways. One way is by transporting it over a long distance in large arrays of devices to an output device where it is sensed to obtain signals representing the charges stored. When small quantities of charge are involved considerable attenuation occurs in the transport process making it difficult to provide high sensitivity in such arrays. Another way is by sensing the charge storage at the charge storage device. In large arrays large capacitances are associated with the sensing circuits and accordingly small signal sensing becomes difficult.

The present invention is particularly directed to overcoming such limitations in solid state imaging apparatus.

A general object of the present invention is to provide improvements in solid state imaging apparatus.

Another object of the present invention is to improve the performance particularly with regard to signal to noise ratio and to increase the capabilities of solid state imaging apparatus.

Another object of the present invention is to obtain image transform information from solid state imaging apparatus for use in reduced bandwidth systems.

In carrying out the invention in one illustrative embodiment thereof there is provided a substrate of semiconductor material of one conductivity type having a major surface. A first means for forming a first plurality of charge storage sites for opposite type carriers adjacent the major surface of the substrate is provided. A second means for forming a second plurality of charge storage sites for opposite carriers adjacent the major surface of the substrate, each coupled to a respective charge storage site of the first plurality to form a plurality of coupled pairs of charge storage sites is also provided. The coupled pairs of charge storage sites are arranged into an array of rows and columns. A plurality of row conductor lines are provided, each row line coupled to the storage sites of the first plurality in a respective row of storage sites. A plurality of column conductor lines are provided, each column line coupled to the storage sites of the second plurality in a respective column of storage sites. Means are provided for exposing the substrate to radiation to generate and store charge in said storage sites of said substrate. Means are provided for obtaining signals proportional to algebraic sums of charge in a selected row of charge storage sites including means for storing charge to be sensed with one sign in the column line coupled sites of the selected row, means for storing charge to be sensed with the opposite sign in the row line coupled sites of the selected row, and means for transferring the charge stored in the column sites of the selected row to the row sites thereof and for transferring the charge stored in the row sites of the selected row to the column sites thereof. Means for sensing the signal induced on the row line of the selected row after the transfer of charge in the storage sites of the selected row.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

FIG. 1 is a plan view of an array or assembly of charge storage devices incorporated in the apparatus of the present invention shown in FIG. 5.

FIG. 2 is a sectional view of the assembly of FIG. 1 taken along section lines 2—2 of FIG. 1.

FIG. 3 is a sectional view of the assembly of FIG. 1 taken along section lines 3—3 of FIG. 1.

FIG. 4 is a sectional view of the assembly of FIG. 1 taken along section lines 4—4 of FIG. 1.

Figure 5:
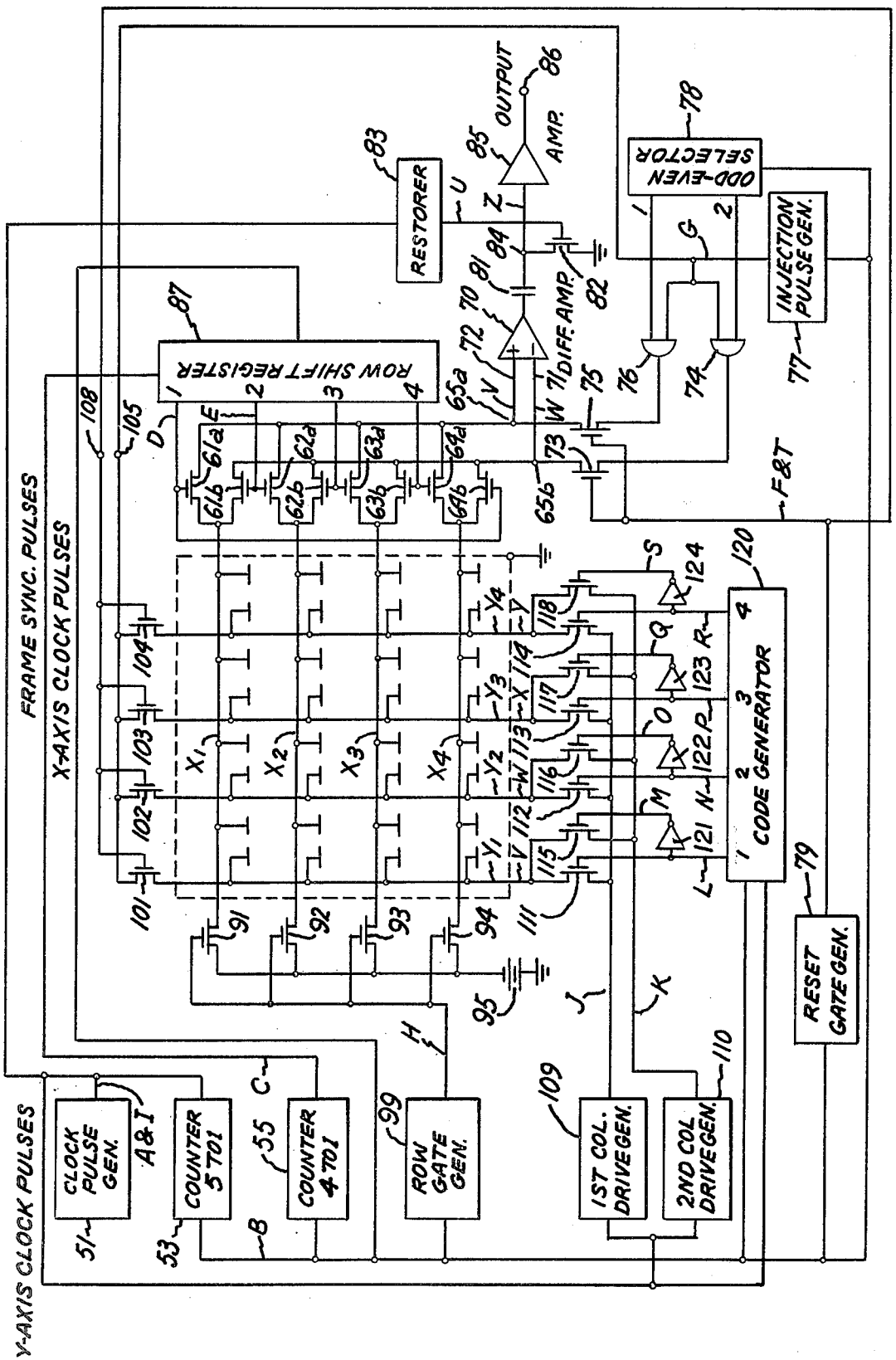
FIG. 5 is a block diagram of an image sensing apparatus in accordance with the present invention.

FIG. 7 shows three tables useful in explaining the operation of the present invention. Table 1 shows a Hadamard matrix of the fourth order. Table 2 represents four equations each including the same independent variables which are algebraically summed according to the code represented by a respective row of the matrix of Table 1. Each of the variables represents a signal corresponding to the charge stored in a respective device of the apparatus of FIG. 5. Table 3 shows four equations in which the independent variables are the four sums of Table 2. The independent variables are summed in accordance with the Hadamard matrix of Table 1 to obtain four sums each proportional to a respective one of the independent variables of Table 2.

Before proceeding to describe the apparatus of FIG. 5 embodying the present invention the array of charge storage and radiation sensing devices used in the apparatus will be described. While a specific form of the array fabricated using a specific technology is shown and described, it will be understood that the array utilized in the apparatus may take on other forms and that any of the commonly used technologies for charge transfer devices may be used in the fabrication thereof. Reference is now made to FIGS. 1–4 which show an array 20 of charge storage and radiation sensing devices 21, such as the device described in FIGS. 2A, 2B and 2C of aforementioned U.S. Pat. No. 3,805,062 arranged in four rows and columns. The array includes four row conductor lines, each connecting the row-oriented plates of a respective row of devices, and are designated from top to bottom $X_1$, $X_2$, $X_3$ and $X_4$. The array also includes four column conductor lines, each connecting the column-oriented plates of a respective column of devices, and are designated from left to right $Y_1$, $Y_2$, $Y_3$ and $Y_4$. Conductive connections are made to lines through conductive landings or contact tabs 22 provided at each end of each of the lines. While in FIG. 1 the row conductor lines appear to cross the column conductor lines, the row conductor lines are insulated from the column lines by a layer 24 of transparent glass as is readily apparent in FIGS. 2, 3 and 4. In FIG. 1 the outline of the structure underlying the glass layer 24 is shown in solid outline for reasons of clarity.

The array includes a substrate or wafer 25 of semiconductor material of N-type conductivity over which is provided an insulating layer 26 contacting a major face of the substrate 25. A plurality of deep recesses 27 are provided in the insulating layer, each for a respective device 21. Accordingly, the insulating layer 26 is provided with thick or ridge portion 28 surrounding a plurality of thin portions 29 in the bottom of the recesses. In each of the recesses is situated a pair of substantially identical conductive plates or conductive members 31 and 32 of rectangular outline. Plate 31 is denoted a row-oriented plate and plate 32 is denoted a column oriented plate. The plates 31 and 32 of a device 21 are spaced close to one another along the direction of a row and with adjacent edges substantially parallel. In proceeding from the left hand portion of the array to the right hand portion, the row-oriented plates 31 alternate in lateral position with respect to the column oriented plates 32. Accordingly, the row-oriented plates 31 of pairs of adjacent devices of a row are adjacent and are connected together by a conductor 33 formed integral with the formation of the plates 31. With such an arrangement a single connection 34 from a row conductor line through a hole 39 in the aforementioned glass layer 24 is made to the conductor 33 connecting a pair of row-oriented plates. The column-oriented conductor lines are formed integrally with the formation of the column-oriented plates 32. The surface adjacent portion of the substrate 25 underlying the space between the plates 31 and 32 of each device 21 is provided with a P-type conductivity region 36. The glass layer 24 overlies the thick portion 28 and thin portion 29 of the insulating layer 26 and the plates 31 and 32, conductors 33 and column-oriented conductor lines $Y_1$-$Y_4$ thereof, except for the contact tabs 22 thereof. The glass layer 24 may contain an acceptor activator and may be utilized in the formation of the P-type region 36. A ring shaped electrode 38 is secured to the major surface of the substrate opposite the major surface on which the devices 21 were formed and provides conductive connection to the substrate. Such a connection to the substrate permits rear face as well as front face illumination of the array.

The array 20 and the devices 21 of which they are comprised may be fabricated using a variety of materials and in variety of sizes in accordance with established techniques for fabricating integrated circuits as described in the aforementioned U.S. Pat. No. 3,805,062.

Referring now to FIG. 5 there is shown a block diagram of apparatus utilizing the charge storage array of FIG. 1 which provides transformed output signals in response to radiation imaged on the array by a lens system (not shown), for example. The transformed output may be utilized directly in various signal processing applications such as pattern recognition and bandwidth compression, or may be transformed into video signals corresponding to the point intensities of the radiation sensed by the individual devices of the array.

The system will be described in connection with FIGS. 6A–6Z which show diagrams of amplitude versus time of signals occurring at various points in the system of FIG. 5. The point of occurrence of a signal of FIGS. 6A–6Z is referenced in FIG. 5 by a literal designation corresponding to the literal designation of the FIGURE reference.

The system includes a clock pulse generator 51 which develops a series of regularly occurring Y-axis pulses 52 of short duration shown in FIG. 6A, occurring in sequence at instants of time $t_0$–$t_{10}$ and representing a half scanning cycle of operation of the array. The output of the clock pulse generator 51 is applied to a first counter 53 which divides the count of the clock pulse generator by five to derive X-axis clock pulses 54, such as shown in FIG. 6B. The output of the first counter 53 is also applied to a second counter 55 which further divides the count applied to it by four to provide frame synchronizing pulses 56 to the array.

The sensing array 20, which is identical to the sensing array of FIG. 1 and is identically designated, includes row conductor lines $X_1$ thru $X_4$ and column conductor lines $Y_1$ thru $Y_4$. The drive circuits for the row conductor lines $X_1$–$X_4$ and for the column conductor lines $Y_1$–$Y_4$ of array 20 are included on the same substrate 50 as the array to minimize the number of external connections which are required to be made for connection of the array 20 into the system.

To enable selective readout of a row of devices a plurality of pairs of row-enable switches $61_a$–$64_a$ and $61_b$–$64_b$ are provided. The row-enable switches $61_a$–$64_a$ and $61_b$–$64_b$ are in the form of MOSFET transistor devices formed integrally on the substrate, each having a source electrode, a drain electrode and a gate electrode. Each of the drains of devices $61_a$–$64_a$ and each of the drains of the devices of $61_b$–$64_b$ is connected to one end of a respective one of the row conductor lines $X_1$–$X_4$. Each of the sources of the devices $61_a$–$64_a$ is connected to row bias terminal $65_a$. Each of the sources of devices $61_b$–$64_b$ is connected to row bias terminal $65_b$. The terminal $65_b$ is connected to the inverting terminal 71 of a differential amplifier 70. The output terminal $65_a$ is connected to the non-inverting 72 terminal of the differential amplifier 70. (A change in voltage at the inverting input terminal of the differential amplifier in one direction in relation to a reference potential produces a change in voltage at the output terminal in the opposite direction in relation to the reference potential. A change in voltage at the non-inverting terminal in one direction in relation to a reference potential produces a change in voltage at the output terminal in the same direction in relation to the reference potential).

The terminal 65b is connected through the source-drain conduction path of reset transistor 73 to the output of the AND gate 74. The terminal 65a is connected through the source-drain conduction path of the reset transistor 75 to the output of the AND gate 76. The AND gate 74 has a pair of input terminals one of which is connected to the output of the injection pulse generator 77 from which the injection pulses 77a of FIG. 6G are obtained. The injection pulse generator 77 is synchronized with the X-axis clock pulses. The other terminal of the AND gate 74 is connected to the even terminal, designated terminal 2, of the odd-even selector 78 which provides a pair of outputs at terminals 1 and 2. The AND gate 76 also has a pair of input terminals one of which is connected to the output of the injection pulse generator 77 and the other input terminal of which is connected to the odd terminal, designated terminal 1, of the odd-even selector 78. The odd-even selector 78 is synchronized with the X-axis clock pulses and provides an output on terminal 1 during the scanning of the odd lines of the array and an output on terminal 2 during the scanning of the even rows of the array. The AND gates 74 and 76 are set so that row readout potential of −6 volts appear at the outputs thereof in the absence of a pair of signals at the input thereof. During the scanning of an odd numbered row of the array the AND gate 76 provides a zero voltage output during the occurrence of the injection pulses 77a of FIG. 6G. During the scanning of an even numbered row of the array the AND gate 74 provides zero voltage output during the occurrence of the injection pulses 77a of FIG. 6G.

The gates of the reset transistor 73 and 75 are connected together and to the output of the reset gate generator 79 on which appears the voltage pulses 80 of FIG. 6F synchronized with the X-axis clock pulses. During the reset interval of pulse 80 the voltages appearing at the output of the AND gates 74 and 76 are applied to the terminals 65b and 65a to enable readout of the devices in each of the rows, as will be explained below.

The output of the differential amplifier 70 is connected through a capacitor 81 and the source drain conduction path of transistor 82 to ground. The gate of the transistor 82 is connected to the output of restorer circuit 83 which is synchronized with the Y-axis clock pulses and provides restorer pulses, shown in FIG. 6U, which are utilized to reference the output of the differential amplifier at the beginning of each algebraic summation of signals corresponding to charge stored in a row of charge storage sites. The output of the differential amplifier 70 is coupled through the capacitor 81 to input terminal 84 of the amplifier 85, output from which is obtained at terminal 86.

The gate electrodes of the transistor pairs 61a and 64b, 62a and 61b, 63a and 62b, 64a and 63b are connected to successive output terminals of the row shift register 87, numbered respectively 1, 2, 3 and 4. The outputs at terminals 1 and 2 of the row shift register are shown, respectively, in FIGS. 6D and 6E. The outputs at terminals 3 and 4 are similar to output of terminal 1 except appropriately delayed in time to occur during the third and fourth row line scan periods, respectively. The input to row shift register 87, referred to as the frame sync pulse, is the pulse obtained at the output of the second counter 55. One frame sync pulse occurs for every twenty Y-axis clock pulses. Oppositely-phased clock drive pulses for the row shift register 87 are derived from the X-axis clock pulses. The oppositely-phased drive line pulses are applied to each of the stages of the row shift register 87 to produce the indicated outputs at the terminals 1-4 thereof. The row shift register 87 may be any of a number of shift registers known to the art. The elements of the shift register 87 may be concurrently formed on the substrate at the same time that the devices of the array 20 are formed.

During the occurrence of the gating pulse of FIG. 6D on terminal 1 of the row scanner 87, transistors 61a and 64b are turned on, connecting row $X_1$ to terminal 65a and connecting row line $X_4$ to terminal 65b. Prior to the instant of time $t_o$, the devices of row $X_4$ have been read out and the charge stored in these devices has been injected into the substrate by the occurrence of an injection pulse 77a of FIG. 6G at the output of the AND gate 74 during the reset interval of pulse 80 of FIG. 6F. At the instant of time $t_1$, after the occurrence of reset pulse 80 applied to reset switches 73 and 75, the voltage on the lines $X_4$ and $X_1$ is set at −6 volts and any charge in the devices of row $X_4$ and $X_1$ is now located in the column cells of the devices, the column lines being at −10 volts.

Reference is now made to FIG. 7 and in particular to Tables 1 and 2 thereof. Table 1 shows a Hadamard matrix of the fourth order having four rows designated A, B, C and D and having four columns designated 1, 2, 3 and 4. Table 2 shows four equations in which the independent variables are signals $E_1$ thru $E_4$ corresponding to charge stored in devices 1 thru 4, respectively, of the first row of the array of FIG. 5. The sums $\Sigma_A$ thru $\Sigma_D$ represent respectively algebraic sums of the signals $E_1$ thru $E_4$ in accordance with the signs set forth in respective rows A thru D on Table 1. In accordance with the present invention the summation signals $\Sigma_A$ thru $\Sigma_D$ are obtained at the output of the apparatus of FIG. 5 by applying the voltage waveforms of FIGS. 6V–6Y to column lines $Y_1$–$Y_4$. Prior to the application of the pulses of FIGS. 6V–6Y to the column lines, the output of the differential amplifier 70 is restored to ground level by the restore pulse occurring at time $t_1$ (FIG. 6U). During the interval from $t_1$ to $t_2$ the voltage on the column lines $Y_1$–$Y_4$ changes from −10 to 0 thereby causing charge to transfer from the column sites to the row sites of the first row of devices and induce a signal $\Sigma_A$ on the line $X_1$ proportional to the sum of the charges in the devices in the first row. This signal is shown in FIG. 6Z. If it is assumed that the relative magnitude of the charges stored in devices 1 thru 4, and hence $E_1$–$E_4$, are respectively 1, 3, 2 and 4, the output appearing at terminal 84 and representing $\Sigma_A$ has a relative value of 10. Various spurious signals such as signals coupled from the column lines to the row lines appear on both rows $X_1$ and $X_4$. As the fourth row is emptied of charge and as the line $X_4$ is connected to the inverting terminal of the differential amplifier 70 such coupled-through signals are cancelled by the differential amplifier and only the summation signal is passed and appears at terminal 84. The organization and operation of the apparatus of FIG. 5 to achieve this result, referred to as differential row readout, is fully described and claimed in copending application Ser. No. 635,703, filed Nov. 26, 1975, and assigned to the assignee of the present invention. During the interval $t_1$ to $t_2$ voltage on column lines $Y_1$ and $Y_2$ drops to −10 volts while the voltages on column lines $Y_3$ and $Y_4$ remain at 0 volts. Thus, charge to be summed with a positive sign is now stored in the column sites of devices 1 and 2 and charge to be summed with a negative sign is stored in the row sites of devices 3 and 4 of the first row.

At the instant $t_2$ on occurrence of the restore pulse, the terminal 84 is set to ground level preparatory to deriving a second summation signal $\Sigma_B$. During the interval from $t_2$ to $t_3$ the voltage on column lines $Y_1$ and $Y_2$ is increased to 0 volts and the voltage on column lines $Y_3$ and $Y_4$ is decreased to −10 volts. Thus, charge transfers from the column sites of devices 1 and 2 into the corresponding row sites and the charge in the row sites of devices 3 and 4 transfer to the column sites of these devices. The summation signal appearing on the row line $X_1$ corresponds to the algebraic summation $\Sigma_B$ in which charge in devices 1 and 2 is summed with a positive sign and the charge in devices 3 and 4 is summed with a negative sign as shown in Table 2 of FIG. 7. Also, during the time interval $t_2$ to $t_3$, the voltage on line $Y_1$ drops to $-10$ allowing the charge to shift from the row site to the column site of the first device, the voltage on column line $Y_2$ remains at zero thus charge continues to be stored in the row site of the second device. The voltage on line $Y_3$ decreases to zero volts shifting the charge in the third device from the column site to the row site. The voltage on line $Y_4$ remains at $-10$ volts and charge continues to be stored in the column site of the fourth device. Thus, at the instant $t_3$ charge in the first and fourth devices are stored in the column sites thereof and the charge in the second and third devices is stored in the row sites thereof.

After resetting the output of the amplifier by the restorer pulse at time $t_3$, the apparatus is set for obtaining the summation $\Sigma_C$ set forth in the third equation of Table 2. During the time interval $t_3$ to $t_4$ voltage on column lines 1 and 4 changes from $-10$ to zero volts to transfer of the charge from the column sites to the row sites of the first and fourth devices and simultaneously the voltage on column lines $Y_2$ and $Y_3$ changes from 0 to $-10$ volts to the transfer charge from the row site to the column site in the second and third devices to produce the summation $\Sigma_C$. Also, during the interval $t_3$ to $t_4$ charge is shifted in the devices so as to reside in the column sites of the first and third devices and in the row sites second and fourth devices.

After resetting the output terminal 84 to ground level at time $t_4$, the charge in column line voltages causes transfer of charge from the column sites of first and third devices to the row sites thereof and also causes the transfer of charge from the row sites of the second and fourth devices to the column sites thereof to provide the summation signal $\Sigma_D$. The summation signals $\Sigma_B$, $\Sigma_C$ and 93 $_D$ are shown in FIG. 6Z having values of $-2$, 0, and $-4$, respectively, based on values for $E_1-E_4$ of 1, 3, 2 and 4, respectively.

At the end of the period during which the summation signals for the devices of row $X_1$ are obtained, the reset pulse 80 of FIG. 6F is applied to the gates of the reset transistors 73 and 74 which allows the injection pulse 77a of FIG. 6G (also FIG. 6T) to appear on terminal 65B and raise the potential of the $X_1$ line to zero to cause injection of the stored charge into the substrate. As will be explained below, during the interval of time that the row line $X_1$ is raised to zero volts the voltages on the column lines which are at $-10$ volts are raised to zero volts to enable injection of the charge stored in the devices of the row $X_1$ into the substrate.

To re-establish storage voltage on all of the row lines, row reset switches 91-94 are provided. The reset switches 91-94 are in the form of MOSFET transistors integrally formed on the substrate 50, each having a drain electrode connected to the other end of a respective one of the row conductor lines $X_1-X_4$ and each having a source electrode connected to the negative terminal of source 95, the positive terminal of which is connected to ground. Each of the gate electrodes of the transistors 91-94 is driven by a common drive signal 98 shown in FIG. 6H obtained from the output of row gate generator 99 and synchronized with the X-axis clock pulses of FIG. 6B.

Figure 6I:
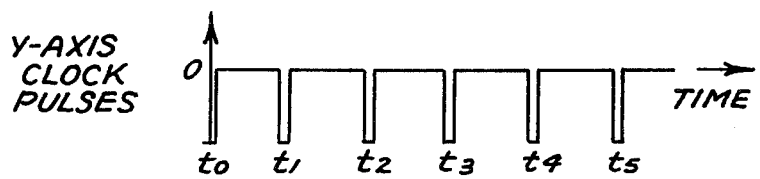
FIGS. 6A through 6Z are diagrams of amplitude versus time of voltage signals occurring at various points in the system of FIG. 5. The point of occurrence of a signal of FIGS. 6A–6Z in the block diagram of FIG. 5 is identified in FIG. 5 by a literal designation corresponding to the literal designation of FIGS. 6A–6Z.

The time of the occurrence of the row gating pulse 98 of FIG. 6H occurs subsequent to the occurrence of the injection pulse 77a of FIG. 6G which occurs during the reset gate pulse 80 of FIG. 6F. The occurrence of the reset gate pulse 80 of FIG. 6F extends beyond the time of occurrence of the row gate pulse 98 of FIG. 6I. Accordingly, when the row gate voltage of FIG. 6E appearing on terminal 2 of the row shift register 87 goes negative and turns on the row enable switches 61b and 62a, the readout potential of $-6$ volts from the AND gates 74 and 76 appears on row line $X_1$ and also on row line $X_2$. The lines $X_1$ and and $X_2$ remain at these potentials when the reset switches 74 and 76 are turned off. The row lines other than $X_1$ and $X_2$ are floated at $-20$ volts by opening of the row reset switches by disappearance of row gate pulses 98 of FIG. 6H. The devices of row $X_2$ are read out in the same manner in which the devices of row $X_1$ are read out. In this case, however, the row $X_1$ is connected through switch 61b to the inverting terminal 71 of the differential amplifier 70 and the row line $X_2$ is connected through transistor 62a to the noninverting terminal 72 of the differential amplifier.

To enable injection of charges from a row of devices which have just been scanned it is essential not ony to drop the row line voltage to zero but also to set the column line voltages to zero for a short interval of time as pointed out above. This latter function is performed by the column line switches 101 thru 104 in the form of MOSFET transistors integrally formed on the substrate and each having a source electrode, a drain electrode and a gate electrode. Each of the drains of the devices 101 thru 104 is connected to one end of a respective one of the column lines $Y_1$ thru $Y_4$ and each of the sources is connected to the column drain terminal 105 which in turn is connected to the output of the injection pulse generator 77. Each of the gates of the devices 101-104 is connected to gate terminal 108 which in turn is connected to the output of the reset gate generator 79. Thus, during the occurrence of the reset gate pulse 80 of FIG. 6F and the injection pulse 77a of FIG. 6G, the column lines $Y_1-Y_4$ are at zero volts thereby enabling the injection of the row just read. The sensing of the charge stored in the devices of row $X_3$ and row $X_4$ is accomplished in a manner similar to the manner in which the sensing of the charge stored in rows $X_1$ and $X_2$ is accomplished.

Figure 6J:
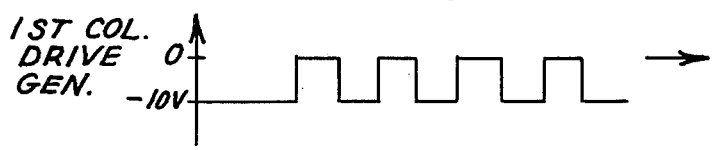
Figure 6K:
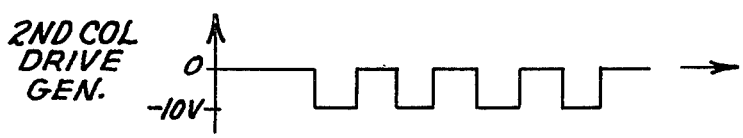

The column line drive voltages of FIGS. 6V thru 6Y are synthesized from waveforms of FIGS. 6J and 6K of the first column drive generator 109 and the second column drive generator 110 under the control of waveforms of FIGS. 6L, 6N, 6P and 6R from the code generator 120 applied to transistor switches 111-118. Each of the transistors 111-114 has a drain electrode connected to the other end of a respective one of the column lines $Y_1$ thru $Y_4$. Also, each of the transistors 115-118 has a drain electrode connected to the other end of a respective one of the column lines $Y_1$ through $Y_4$. The sources of the transistors 111-114 are connected to the first column drive generator 109 and the sources of the transistors 115-118 are connected to the second column drive generator 110. The pulses provided at the output of the first column drive generator 109 and the second column drive generator 110 are shown, respectively, in FIGS. 6J and 6K. The first column drive generator 109 provides a 10 volt pulse 119 from a base reference of $-10$ volts within the intervals $t_1-t_2$, $t_2-t_3$, $t_3-t_4$ and $t_4-t_5$. The second column drive generator 110 provides an output which is the complement of the output of the first column drive generator. Each of the gates of the transistors 111–114 is connected respectively to terminals 1–4 of the code generator 120. The outputs at terminals 1–4 of the code generator 120 to the inputs of which are applied the Y-axis and X-axis pulses are shown in FIGS. 6L, 6N, 6P and 6R, respectively. Each of the gates of the transistors 115–118 is connected through a respective one of inverters 121–124 to a respective one of terminals 1–4 of code generator 120. The outputs of the inverters 121–124 are shown in FIGS. 6M, 6O, 6Q and 6S, respectively.

Figure 6L:
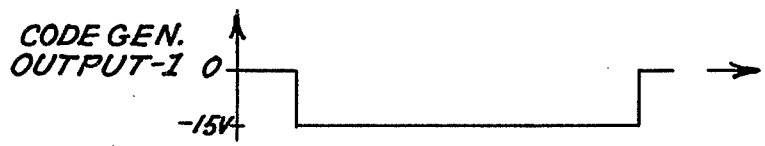
Figure 6M:
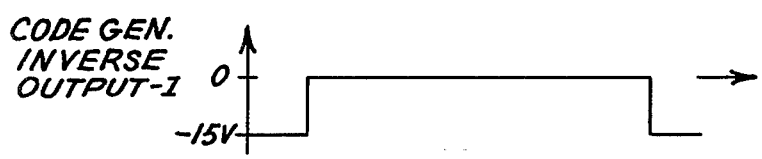
Figure 6N:
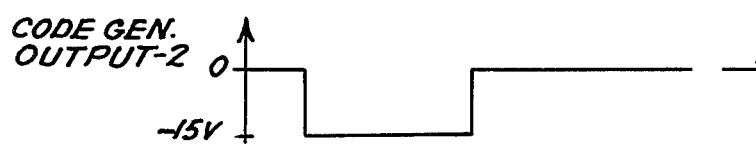
Figure 6O:
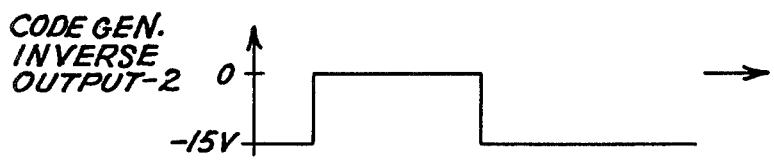
Figure 6P:
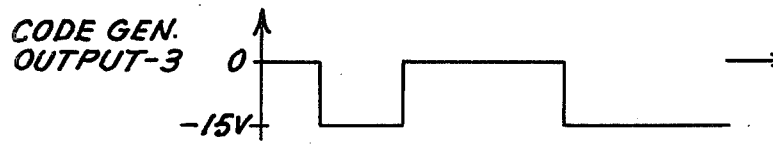
Figure 6Q:
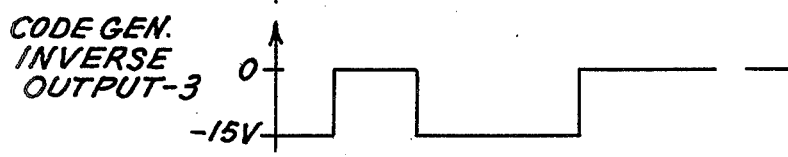
Figure 6R:
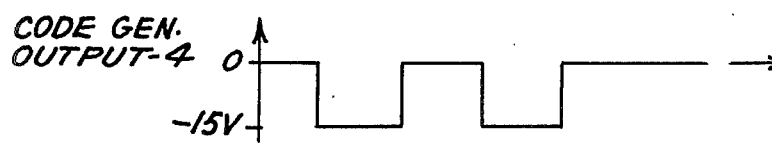
Figure 6S:
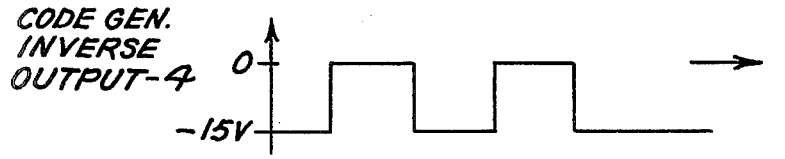

With transistor switch 111 turned ON by the voltage waveform of FIG. 6L from a time just prior to $t_1$ to a time just subsequent to $t_5$, the output of the first column drive generator (FIG. 6J) is applied directly to column line 1 to produce the waveform shown in FIG. 6V. With respect to the second column line $Y_2$, as the transistor switch 112 is on from a time just prior to the time $t_1$ to a time just prior to the time $t_3$ and as the transistor switch 116 is on from a time just prior to $t_3$ to the remainder of the period of row scan the waveform of voltage appearing on column line 2 is a composite of the waveforms from the first column drive generator 109 and the second column drive generator 110. Over the period time from a time just prior to $t_1$ to a time just prior to $t_3$ the first column drive generator output appears on the second column line and from the time just prior to $t_3$ for the remainder of the period the waveform of the second column drive generator appears thereon. The waveform appearing on column line $Y_2$ is shown in FIG. 6W. Similarly, the switching of the waveforms of the first and second column drive generators onto the third column line $Y_3$ in response to the gating waveforms of FIGS. 6P and 6Q produces the composite output shown in waveform of FIG. 6X. Finally, voltage appearing on the fourth column line $Y_4$ shown in FIG. 6Y is produced by combining the outputs of the first and second column generators in response to the gating waveforms of FIGS. 6R and 6S.

As mentioned above, the selected pair of rows of devices is read out by resetting the selected pair of row lines to their readout level of voltage of -6 volts and allowing the row lines to float, any uncertainty in the voltage appearing on the selected lines when the switches 73 and 75 are opened will appear at the output of the amplifier as an interferring signal. This interferring signal or noise is minimized by the restorer circuit including the capacitor 81, the transistor 82, and the restorer drive generator 83. After the reset switches 73 and 75 are closed by the return of the reset gate voltage of FIG. 6F to zero, the restorer pulse of FIG. 6U occurring at time $t_1$ and applied to the gate of the transistor 82 absorbs the interferring signal across capacitor 81. In subsequent sensing of devices on the selected row, the net output voltage of the differential amplifier 70 has subtracted from it the noise voltage on capacitor 81, and accordingly the input voltage at terminal 84 applied to the amplifier 85 is relatively free of this component of noise.

In the operation of the apparatus, the voltage of the row line source 95 which is shown as −20 volts establishes a charge storage capability of the row connected or oriented cells of each of the devices of the array and the base voltage of −10 volts of the outputs of the first column drive generator 109 and the second column drive generator 110 shown in FIGS. 6J and 6K establishes the charge storage capability of the column connected or oriented cells of each of the devices of the array. Under the control of the clock pulse generator, frame synchronizing pulses, such as shown in FIG. 6C, are applied to the row shift register 87. Line interval gating pulses, two of which are shown for lines $X_1$ and $X_2$ in FIGS. 6D and 6E, respectively, are derived at the output points 1–4 of the row shift register 87 in response to line rate clocking of the row shift register by the X-axis clock pulses. The line interval gating pulses are utilized to gate in sequence the pairs of row enable switches 61a and 64b, 62a and 61b, 63a and 62b, 64a and 63b to apply in sequence the readout voltage level appearing on terminals 65a and 65b to sequential pairs of row lines $X_1$–$X_4$.

The readout voltage level of −6 volts is applied to the terminals 65a and 65b through reset switches 73 and 75 which are turned on at the end of a row scan operation to apply the outputs of the AND gates 74 and 76, the output levels of which are −6 volts, to the terminals 65a and 65b and hence to a pair of row lines. As pointed out above, during the reset interval of the pulse 80 (FIG. 6F) one of the pair of row lines is raised (pulse 77a of FIG. 6G) to zero volts by action of the injection circuit 77 and the odd-even selector circuit 78 to empty that row of the pair of rows which has been read out. During the injection interval the voltage of the column line conductors $Y_1$–$Y_4$ through the action of the switches 101 thru 104 is maintained at zero volts. Thus, during the reset gate interval of pulse 80 of FIG. 6F, the charge stored in the row of devices just sensed is injected into the substrate.

Readout of the devices of the first row is accomplished by utilization of the waveforms of FIG. 6V through 6Y applied to column lines $Y_1$ thru $Y_4$ respectively as described above. The affect of applying such waveforms to the column line provides signals representing algebraic summations of the charge stored in the storage sites of the devices of the first row. The summation signal appears on the row line directly. This result is achieved by storing the charges to be summed with a positive sign in the column sites of each of the devices of the row prior to a summation operation. Charges to be summed with a negative sign are transferred or held in the row sites of the devices. To obtain the algebraic summation, the charges stored in the column sites are transferred to the coupled row sites and the charges stored in the row sites are transferred to the coupled column sites, each inducing component signals in the row line $X_1$. The resultant transfer of charge produces a signal on the row line $X_1$ which represents the algebraic sum of the charges stored in the devices of the first row. A plurality of summation signals for the first row of devices are obtained as explained above by non-destructively sensing the stored charges. When the desired summation signals are obtained, the charge stored in the devices of the first row is removed from the devices by injection into the substrate, as also explained above. After the first row has been read out and the stored charge injected into the substrate, the other rows of the array are similarly read out in sequence.

The summation signals obtained from the array could be utilized directly for such applications as pattern recognition and bandwidth compression. If desired, the summation signals could be reconverted into signals representing the charge stored in each of the devices of the array. This result could be obtained by any apparatus which is capable of performing the algebraic summations set forth in Table 3 of FIG. 7. In Table 3 of FIG. 7 each of the summation signals is proportional to a respective one of the signals $E_1$, $E_2$, $E_3$ and $E_4$ multiplied by a factor of four. Thus, a particular advantage of simultaneously reading out a plurality of devices in an array is that signal to noise ratio of the apparatus is enhanced.

While in the apparatus of FIG. 5 the summation signals were in accordance with a Hadamard matrix to provide a Hadamard transform of the charge stored in the devices of the array with each summation signal corresponding to a transform point, it will be understood other transforms may be utilized in accordance with the present invention.

While the apparatus of the invention described in connection with FIG. 5 included the array of FIG. 1, it is apparent that other arrays, such as the array described in U.S. Pat. No. 3,882,531, assigned to the assignee of the present invention, and including a semiconductor substrate of one conductivity type having an epitaxial layer of the opposite type thereon, may be used.

While in the exemplary embodiment of the invention the potential applied to row lines is twice the potential applied to the column lines, other ratios of potentials may be utilized provided the potential utilized for the row lines is sufficiently greater than the potential utilized for the column lines so that charge stored in a device may be stored entirely in the row connected cell of the device.

While in the exemplary embodiment injection from a row of devices is accomplished by collapsing the potential on the row line to the potential of the substrate, such a requirement is not essential. A small bias corresponding to the threshold voltage of the conductor-insulator-semiconductor storage capacitor or cell may be maintained between the row line being addressed and the substrate to maintain a bias charge in the row connected cell to avoid the adverse effects of emptying and filling the surface states of semiconductor substrate. Of course, when the voltage on a row line is collapsed to inject charge into the substrate, the voltage on the column lines should be at the same bias potential. In addition to avoiding adverse effects such as produced by the existence of surface states in the substrate, the bias charge in the cells of the device facilitates transfer of charge between the row connected and column connected cells of a device. This mode of operation is illustrated and explained in the aforementioned U.S. Pat. No. 3,805,062 in connection with FIGS. 9a–9E thereof.

While the invention has been described in connection with an array of 16 devices, it is apparent that the invention is particularly applicable to arrays including devices many times greater in number than 16. Also, the devices may be organized in arrangements other than shown.

While the invention has been described in connection with an array constituted of an N-type conductivity substrate, a P-type conductivity substrate could as well be used. Of course, in such a case the applied potentials would be reversed in polarity.

While the invention has been described in specific embodiments, it will be appreciated that modifications, such as those described above, may be made by those skilled in the art, and it is intended by the appended claims to cover all such modifications and changes as fall within the true spirit and scope of the invention.

What we claim as new and desire to secure by Letters Patent of the United States is:

1. In combination,
    a substrate of semiconductor material of one type conductivity having a major surface,
    first means forming a first plurality of charge storage sites for opposite type carriers adjacent said major surface of said substrate,
    second means forming a second plurality of charge storage sites for opposite type carriers adjacent said major surface of said substrate, each coupled to a respective charge storage site of said first plurality to form a plurality of coupled pairs of charge storage sites,
    said coupled pairs of charge storage sites being arranged in an array of rows and columns,
    a plurality of row conductor lines and a plurality of column conductor lines,
    said first means including a first plurality of electrodes each insulatingly overlying a respective one of said storage sites of said first plurality, each of the electrodes of said first plurality in a respective row of sites being connected to a respective row line,
    said second means including a second plurality of electrodes, each insulatingly overlying a respective one said storage sites of said second plurality, each of the electrodes of said second plurality in a respective column of sites being connected to a respective column line,
    means for exposing said substrate to radiation to generate and store charge in said storage sites of said substrate,
    means for obtaining signals proportional to algebraic sums of charge in a row of charge storage sites including:
    means for storing charge to be sensed with one sign in the colum line coupled sites of said row,
    means for storing charge to be sensed with the opposite sign in the row line coupled sites of said row,
    means for transferring the charge stored in the column sites of said row to the row sites thereof and for transferring the charge stored in the row sites of said row to the column sites thereof,
    means for sensing the signal induced on said first plurality of electrodes of said row in response to the transfer of charge in the storage sites of said row.

2. The apparatus of claim 1 including means for obtaining signals proportional to algebraic sums of charge in a row of charge storage sites for each of said rows of devices in sequence.

3. The apparatus of claim 1 in which said means for storing charge to be sensed with one sign in the column line site includes means for setting the storage potential on the corresponding column lines lower than the storage potential on said row line, and in which said means for storing charge to be sensed with opposite sign in the row line coupled sites includes means for setting the storage potentials on the corresponding column lines higher than the storage potential on said row line.

4. The apparatus of claim 1 in which said algebraic sums constitute a complete set of transform points of the charge in said coupled pairs of charge storage sites of said row.

5. The apparatus of claim 4 in which said complete set of transform points is a Hadamard transform.

* * * * *